(12) United States Patent
Lee et al.

(10) Patent No.: US 12,127,460 B2
(45) Date of Patent: Oct. 22, 2024

(54) DISPLAY PANEL AND DISPLAY DEVICE

(71) Applicant: LG Display Co., Ltd., Seoul (KR)

(72) Inventors: Eunhye Lee, Paju-si (KR); Taehwan Kim, Paju-si (KR); Hyeonchul Im, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 409 days.

(21) Appl. No.: 17/521,527

(22) Filed: Nov. 8, 2021

(65) Prior Publication Data

US 2022/0208879 A1 Jun. 30, 2022

(30) Foreign Application Priority Data

Dec. 30, 2020 (KR) ........................ 10-2020-0188358

(51) Int. Cl.
*H10K 59/35* (2023.01)
*G06F 3/044* (2006.01)
*H10K 50/84* (2023.01)
*H10K 50/86* (2023.01)
*H10K 59/38* (2023.01)
*H10K 59/40* (2023.01)

(52) U.S. Cl.
CPC ......... *H10K 59/353* (2023.02); *G06F 3/0443* (2019.05); *H10K 50/84* (2023.02); *H10K 50/865* (2023.02); *H10K 59/38* (2023.02); *H10K 59/40* (2023.02); *G06F 2203/04111* (2013.01)

(58) Field of Classification Search
CPC ........ H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00; H10K 59/353; H10K 50/84; H10K 50/865; H10K 59/38; H10K 59/40; H10K 50/844; H10K 59/1201; H10K 59/12; H10K 59/35; G06F 3/0443; G06F 2203/04111; G06F 3/0446; G06F 2203/04112; G06F 3/0412; G06F 3/0445

See application file for complete search history.

(56) References Cited

U.S. PATENT DOCUMENTS

2019/0129551 A1* 5/2019 Lee .................. G02F 1/1345
2019/0155417 A1  5/2019 Lee et al.
2019/0339818 A1  11/2019 Rhe et al.

* cited by examiner

*Primary Examiner* — Mohammad A Rahman
(74) *Attorney, Agent, or Firm* — Birch, Stewart, Kolasch & Birch, LLP

(57) ABSTRACT

A display panel and a display device capable of reducing peeling due to a decrease in interlayer adhesion by direct contact of a color filter with a first insulating layer are provided.

14 Claims, 16 Drawing Sheets

DISPLAY PANEL AND DISPLAY DEVICE

CROSS REFERENCE TO RELATED APPLICATION

This application claims priority to Korean Patent Application No. 10-2020-0188358, filed in the Republic of Korea on Dec. 30, 2020, the entire contents of which are hereby expressly incorporated by reference for all purposes as if fully set forth herein into the present application.

BACKGROUND

Technical Field

The present disclosure relates to a display panel and a display device.

Discussion of the Background Art

The growth of the information society leads to increased demand for various types of display devices. In recent years, various display devices such as a liquid crystal display device, a plasma display device and an organic light emitting display device are utilized.

Among these display devices, there is a touch display device that provides a touch-based input method in order for a user to intuitively and conveniently input information or a command instead of a conventional input method such as using a button, a keyboard, or a mouse. The touch display device can include a touch electrode for sensing a touch input in order to provide a touch-based input method.

A touch display device can include a touch electrode and a color filter for increasing color reproducibility. The touch electrode and the color filter can be embedded in a display panel in order to reduce the thickness and weight of the display device. In order to embed the touch electrode and the color filter in the display panel, the touch electrode and the color filter can be formed after forming a light emitting device of the color filter.

However, in the case that the touch electrode and the color filter are formed at a low temperature to prevent damage to the light emitting device after forming the light emitting device, there may be a limitation in that the interlayer adhesion can be lowered and a delamination between layers can occur in the process of peeling off a protection film.

SUMMARY OF THE DISCLOSURE

Embodiments of the present disclosure provides a display panel and a display device capable of reducing a delamination between layers due to a decrease in interlayer adhesion, by direct contact of a color filter with a first insulating layer.

In one aspect, embodiments of the present disclosure can provide a display panel including a substrate, an encapsulation layer disposed on the substrate, a bridge disposed on the encapsulation layer, a first insulating layer disposed on the encapsulation layer, a touch electrode disposed on the first insulating layer, a touch buffer layer disposed on the touch electrode, and a color filter disposed on the touch buffer layer.

The substrate can include a plurality of subpixels including a light emitting region. The bridge can be positioned at a periphery of the light emitting region. The first insulating layer can include a first hole corresponding to the bridge.

The touch electrode can include a second hole corresponding to the light emitting region, and can be in contact with the bridge through the first hole.

The touch buffer layer can include a third hole positioned in the second hole. The color filter can be in direct contact with the first insulating layer through the third hole.

The first insulating layer is an organic insulating layer, and the touch buffer layer is an inorganic insulating film or layer. The first insulating layer can include a concave portion corresponding to the light emitting region.

The second hole and the third hole can be positioned to correspond to the concave portion.

The display panel can further include a black matrix disposed on the touch electrode and positioned at the periphery of the light emitting region. The black matrix can be positioned to overlap the bridge.

The display panel can further include a second insulating layer disposed on the touch electrode and the color filter.

In another aspect, embodiments of the present disclosure can provide a display device including a display panel and a control unit for controlling the display panel.

According to embodiments of the present disclosure, it is possible to provide a display panel and a display device capable of reducing delamination between layers due to deterioration of interlayer adhesion.

According to embodiments of the present disclosure, it is possible to provide a display panel and a display device capable of reducing delamination between layers due to deterioration of interlayer adhesion by including a color filter in direct contact with a first insulating layer through a third hole.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
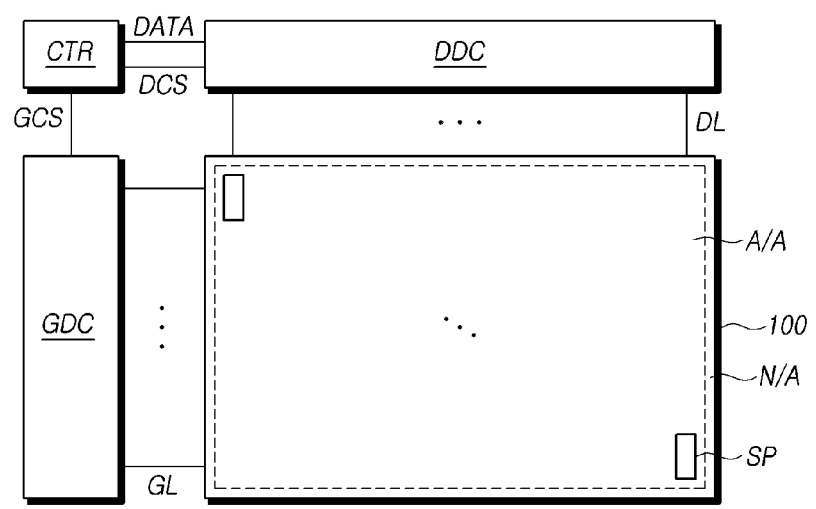
FIGS. 1 and 2 illustrate a system configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another.

Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a structural diagram illustrating an embodiment of a display device according to the present disclosure. All the components of each display device according to all embodiments of the present disclosure are operatively coupled and configured.

Referring to FIG. 1, a display device 10 according to the embodiments of the present disclosure can include a display panel 100 including an active area A/A and a non-active area N/A, and a gate driving circuit GDC, a data driving circuit DDC, and a controller CTR as a control unit. The controller CTR can include one or more processors, micro-processors, integrated circuits, etc.

In the display panel 100, a plurality of gate lines GL and a plurality of data lines DL crossing the gate lines GL are disposed, and a subpixel SP can be disposed in each region where a gate line GL and a data line DL intersect.

In addition, the display panel 100 can be a liquid crystal panel. The liquid crystal panel can include a pixel electrode, a common electrode, and a liquid crystal layer disposed between the pixel electrode and the common electrode. The liquid crystal layer can display an image by blocking or transmitting light by deforming the molecular arrangement in response to a voltage applied to the pixel electrode and the common electrode.

The gate driving circuit GDC is controlled by the controller CTR, and can sequentially output a scan signal to a plurality of gate lines GL disposed on the display panel 100 so as to control the driving timing of the plurality of subpixels SP.

The data driving circuit DDC can receive image data from the controller CTR and convert the image data into an analog data voltage. The data driving circuit DDC outputs a data voltage to each data line DL according to a timing of applying of a scan signal through the gate line GL, so that each subpixel SP can express brightness according to image data.

The controller CTR can supply various control signals to the gate driving circuit GDC and the data driving circuit DDC, and can control the operations of the gate driving circuit GDC and the data driving circuit DDC.

The display device 10 can further include a power management integrated circuit for supplying various voltages or currents to the display panel 100, a gate driving circuit (GDC), a data driving circuit (DDC), or the like, or controlling various voltages or currents to be supplied.

The display device 10 according to the present embodiments can be an organic light emitting display device, a liquid crystal display device, a plasma display device, or the like.

In the case that the display device 10 according to the present embodiments is an organic light emitting display device, each subpixel SP arranged on the display panel 100 can include circuit elements such as an organic light emitting diode (OLED) as a self-luminous element, and a driving transistor for driving the organic light emitting diode.

The type and number of circuit elements constituting each subpixel SP can be variously determined according to a provided function and a design method.

Figure 2:
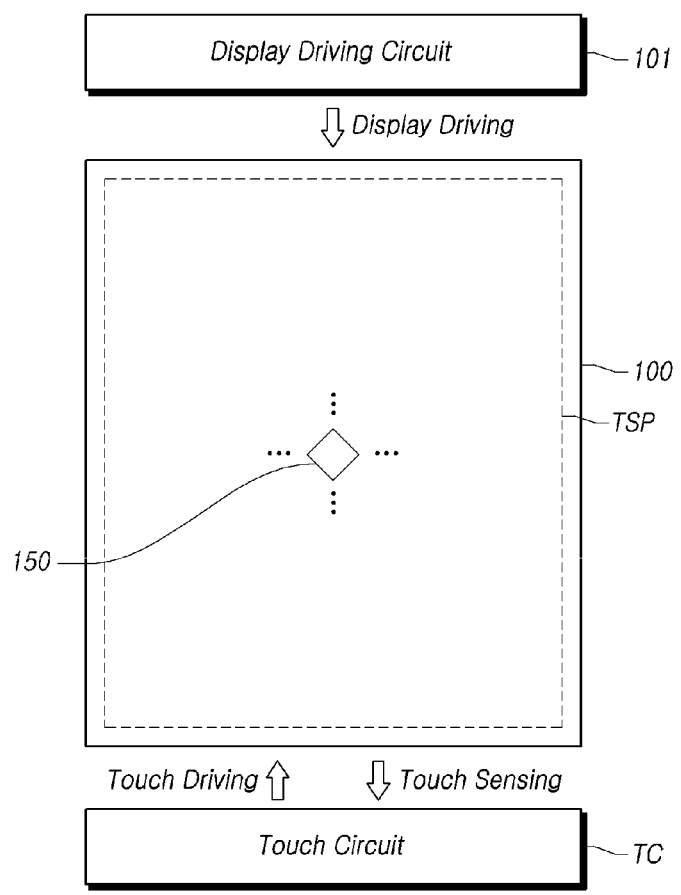

FIG. 2 briefly illustrates a display device according to embodiments of the present disclosure.

Referring to FIG. 2, the display device 10 according to the embodiments can provide an image display function for displaying an image and a touch sensing function for sensing a user's touch.

The display device 10 according to the embodiments can include, for displaying the image, a display panel 100 on which data lines and gate lines are disposed, and a display driving circuit 101 for driving the display panel 100.

The display driving circuit 101 can functionally include a data driving circuit for driving the data lines, a gate driving circuit for driving the gate lines, and a controller for controlling the gate driving circuit and the data driving circuit.

The display driving circuit 101 can be implemented with one or more integrated circuits.

The display device 10 according to the embodiments can include, for touch sensing, a touch panel TSP on which a plurality of touch electrodes TE are disposed as a touch sensor and a plurality of touch lines TL electrically connected to all or part of the plurality of touch electrodes TE are disposed, and a touch circuit TC for sensing the presence of a touch or a touch position by driving the touch panel TSP.

The touch circuit TC can supply a touch driving signal to the touch panel TSP to drive the touch panel TSP, detect a touch sensing signal from the touch panel TSP, and sense whether there is a touch and/or the touch position (touch coordinates).

The touch circuit TC can be implemented as one or more components (e.g., an integrated circuit), and can be implemented separately from the display driving circuit 101.

In addition, all or part of the touch circuit TC can be implemented by being integrated with the display driving circuit 101 or an internal circuit thereof. For example, the touch driving circuit of the touch circuit TC can be implemented as an integrated circuit together with the data driving circuit of the display driving circuit 101.

Meanwhile, the display device 10 according to embodiments can sense a touch based on capacitance formed in the touch electrodes TE.

In addition, the display panel 100 of the display device 10 according to the embodiments can be of various types such as an organic light emitting diode panel (OLED Panel), a liquid crystal display panel (LCD Panel), and the like. Hereinafter, for convenience of description, it will be mainly described an organic light emitting diode panel (OLED Panel) as an example.

Figure 3:
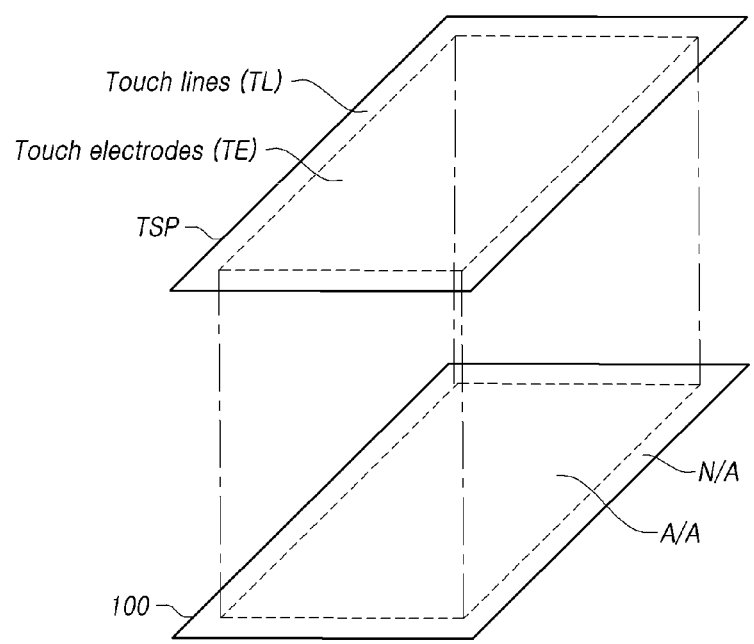
FIG. 3 illustrates a display panel according to embodiments of the present disclosure.

Referring to FIG. 3, the display panel 100 includes an active area A/A in which an image is displayed and a non-active area N/A that is an area outside the active area A/A. Here, the active area A/A is also referred to as a display area, and the non-active area N/A is also referred to as a non-display area.

The plurality of subpixels defined by data lines and gate lines can be arranged in the active area A/A.

In the non-active area A/A, there can be provided with lines and pads for connecting data lines, gate lines, and various signal lines in the active area A/A to the display driving circuit 101.

A plurality of touch electrodes TE and a plurality of touch lines TL can be disposed on the touch panel TSP.

The plurality of touch electrodes TE can be positioned to correspond to the active area A/A of the display panel 100.

A plurality of touch lines TL can be positioned to correspond to the non-active area N/A of the display panel 100.

For example, the plurality of touch lines TL can be disposed outside the touch electrode area (the active area A/A or the corresponding area) in which the plurality of touch electrodes TE are disposed.

The touch panel TSP can be built-in or external to the display panel 100.

As described above, the touch electrodes TE are disposed in the active area A/A of the display panel 100, and the touch lines TL are disposed in the non-active area N/A of the display panel 100, so that it is possible to provide touch sensing matched to the display state.

Figure 4:
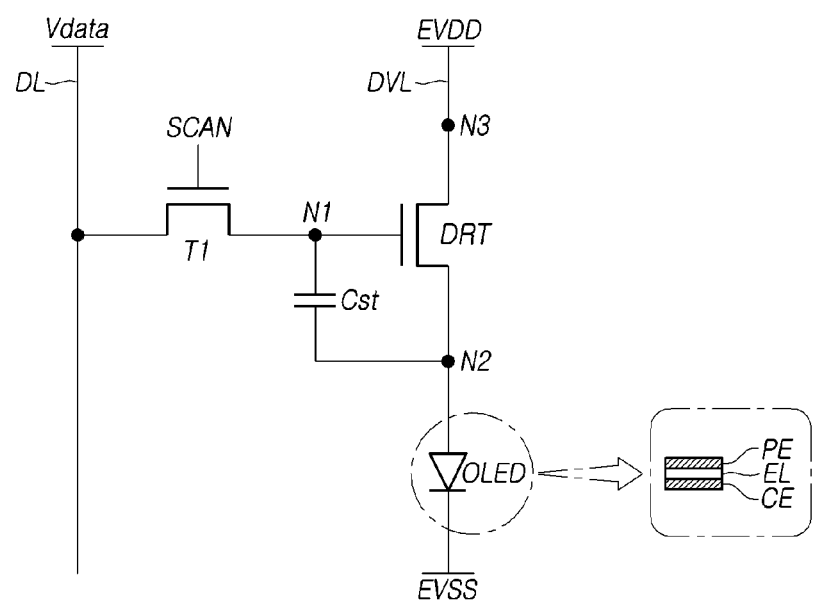
FIGS. 4 and 5 illustrate examples of the subpixel structures of a display panel according to embodiments of the present disclosure.
Figure 5:
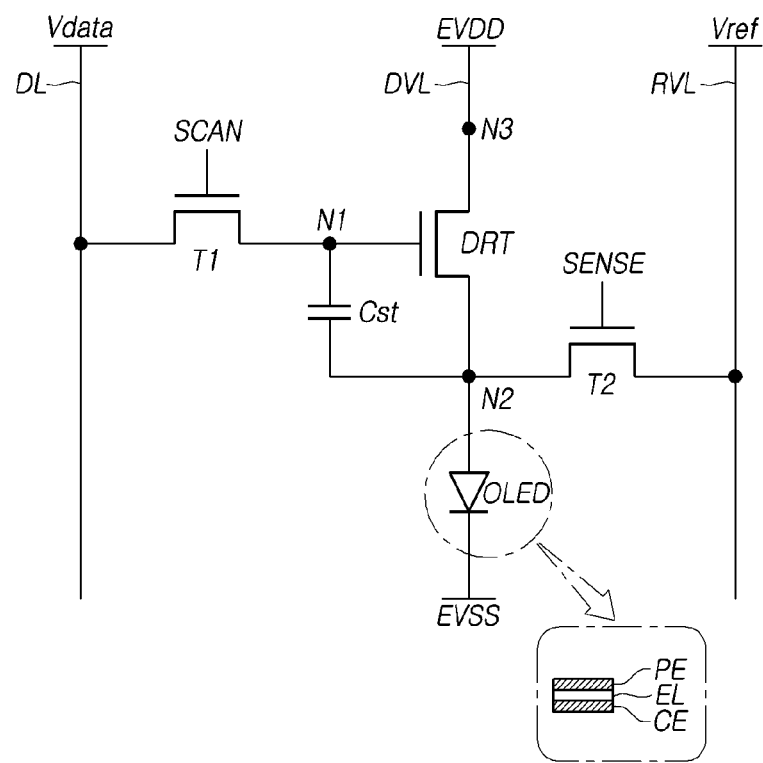

FIGS. 4 and 5 illustrate examples of subpixel structures of display devices according to embodiments.

More specifically, FIGS. 4 and 5 illustrate examples of subpixel structures in the case that a display panel of a display device according to embodiments is an organic light emitting display panel.

Referring to FIGS. 4 and 5, in the case that the display device 10 according to the embodiments is an organic light emitting display device, each subpixel basically includes an organic light emitting diode (OLED), a driving transistor DRT for driving the organic light emitting diode, a first transistor T1 for transferring the data voltage to a first node N1 corresponding to a gate node of the driving transistor DRT, and a storage capacitor Cst for maintaining the data voltage corresponding to the image signal voltage or a voltage corresponding thereto for one frame time.

The organic light emitting diode (OLED) can include a first electrode PE (e.g., an anode electrode or a cathode electrode), an organic layer EL, and a second electrode CE (e.g., a cathode electrode or an anode electrode). The organic layer includes one or more light emitting layers and can further include a hole injection layer, a hole transport layer, an electron transport layer, an electron injection layer, a charge generation layer, etc.

A ground voltage EVSS can be applied to the second electrode CE of the organic light emitting diode (OLED).

The driving transistor DRT can drive the organic light emitting diode by supplying a driving current to the organic light emitting diode.

The driving transistor DRT can include a first node N1, a second node N2 and a third node N3.

The first node N1 of the driving transistor DRT is a node corresponding to a gate node, and can be electrically connected to a source node or a drain node of the first transistor T1.

The second node N2 of the driving transistor DRT can be electrically connected to the first electrode PE of the organic light emitting diode OLED, and can be a source node or a drain node.

The third node N3 of the driving transistor DRT is a node for applying a driving voltage EVDD, and can be electrically connected to a driving voltage line DVL for supplying the driving voltage EVDD, and can be a drain node or a source node.

The first transistor T1 can be electrically connected between the data line DL and the first node N1 of the driving transistor DRT, and can be controlled by receiving a scan signal SCAN at the gate node through the gate line.

The first transistor T1 can be turned on by the scan signal SCAN to transmit the data voltage Vdata supplied from the data line DL to the first node N1 of the driving transistor DRT.

The storage capacitor Cst can be electrically connected between the first node N1 and the second node N2 of the driving transistor DRT.

The storage capacitor Cst is not a parasitic capacitor (e.g., Cgs, Cgd) which is an internal capacitor existing between the first node N1 and the second node N2 of the driving transistor DRT, but is an external capacitor intentionally designed outside the driving transistor DRT.

Meanwhile, for a voltage control of the second node N2 of the driving transistor DRT, or for sensing a characteristic value of a subpixel (e.g., a threshold voltage or mobility of the driving transistor DRT, a threshold voltage of an organic light emitting diode etc.), as shown in FIG. 5, each subpixel can further include a second transistor T2.

The second transistor T2 can be electrically connected between the second node N2 of the driving transistor DRT and a reference voltage line RVL supplying a reference voltage Vref, and can be controlled by receiving a sensing signal SENSE, which is a type of scan signal, at a gate node.

The second transistor T2 can be turned on by the sensing signal SENSE to apply the reference voltage Vref supplied through the reference voltage line RVL to the second node N2 of the driving transistor DRT.

Further, the second transistor T2 can be used as one of the voltage sensing paths for the second node N2 of the driving transistor DRT.

Meanwhile, the scan signal SCAN and the sensing signal SENSE can be separate gate signals. In this case, the scan signal SCAN and the sensing signal SENSE can be respectively applied to the gate node of the first transistor T1 and the gate node of the second transistor T2 through different gate lines.

In some cases, the scan signal SCAN and the sensing signal SENSE can be the same gate signal. In this case, the scan signal SCAN and the sensing signal SENSE can be commonly applied to the gate node of the first transistor T1 and the gate node of the second transistor T2 through the same gate line.

Each of the driving transistor DRT, the first transistor T1, and the second transistor T2 can be an n-type transistor or a p-type transistor.

Figure 6:
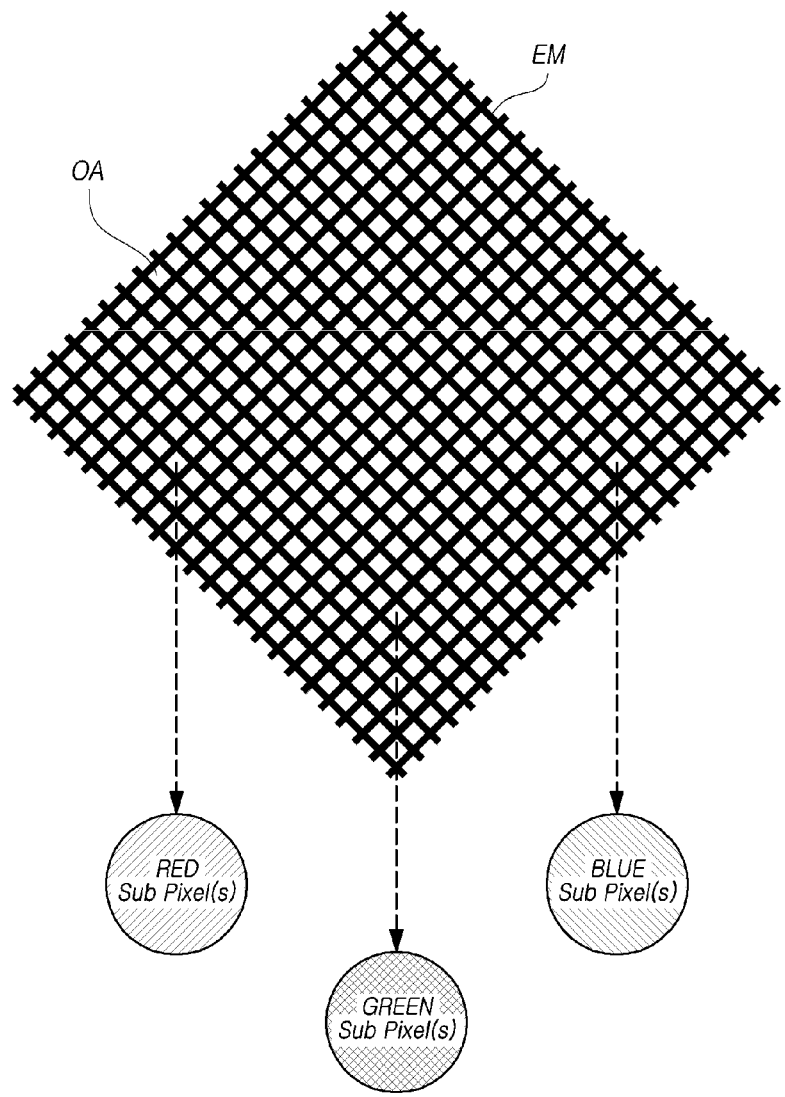
FIG. 6 illustrates a correspondence relationship between a region of a mesh-type touch electrode and a subpixel region of a display panel according to embodiments of the present disclosure.

FIG. 6 illustrates a correspondence relationship between a region of a mesh-type touch electrode TE and a subpixel region in the display device 10 according to embodiments of the present disclosure.

Referring to FIG. 6, in the display device 10 according to the exemplary embodiment, each of the plurality of touch electrodes TE can be an electrode metal EM in which holes OA exist by being patterned in a mesh-type. Here, the hole OA also referred to as an open area.

In the touch electrode TE formed by patterning the electrode metal EM in a mesh-type, each of the holes OA can correspond to a light emitting region of one or more subpixels.

For example, in the case that the display panel 100 is an LCD panel, the light emitting region of the subpixel can include a pixel electrode or a color filter. In the case that the display panel 100 is an OLED panel, the light emitting region of the subpixel can include an anode electrode of an organic light emitting diode, an organic light emitting layer, and the like, and in some cases, a color filter, etc.

As described above, when viewed in a plan view, the electrode metal EM of the touch electrode TE is patterned in which the light emitting region of one or more subpixels corresponds to the position of each of the open areas OA existing in the area of the touch electrode TE, so that the luminous efficiency of the display panel 100 can be increased even when the electrode metal EM is made of an opaque material.

Figure 7:
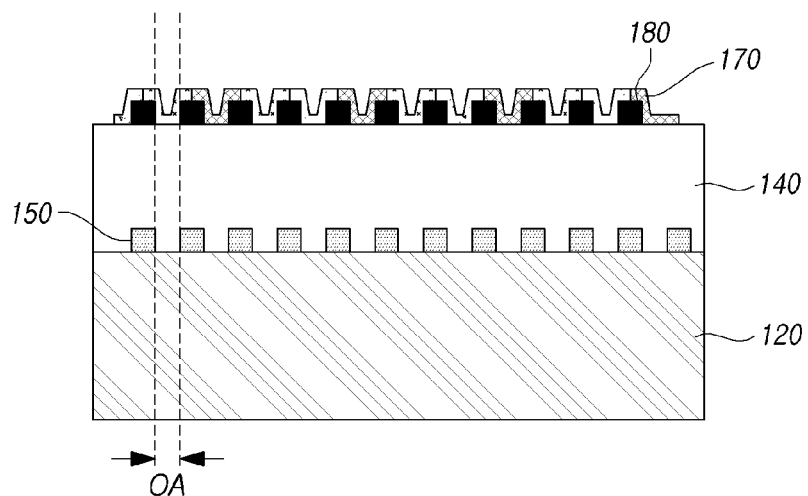
FIG. 7 illustrates a cross-section of a display panel according to embodiments of the present disclosure.

FIG. 7 briefly illustrates a cross-section of a display panel 100 according to embodiments of the present disclosure.

Referring to FIG. 7, the display panel 100 can include an encapsulation layer 120, a touch electrode 150 positioned on the encapsulation layer 120, a first insulating layer 140 positioned on the touch electrode 150, a color filter 170 positioned on the first insulating layer 140, and a black matrix 180 positioned on the first insulating layer 140.

The encapsulation layer 120 is a layer for protecting circuit devices such as light emitting devices positioned on the display panel 100 from external moisture and oxygen, and can be formed as a multi-layer or a single layer.

The touch electrode 150 can be a touch sensor metal such as the above-described touch electrode TE and touch line TL. The touch electrode 150 can include a hole OA corresponding to the light emitting region of the subpixel.

The touch electrode 150 can be connected by a bridge positioned on a different layer from the touch electrode 150.

The touch electrode 150 can be a single layer or a multi-layer.

Figure 8:
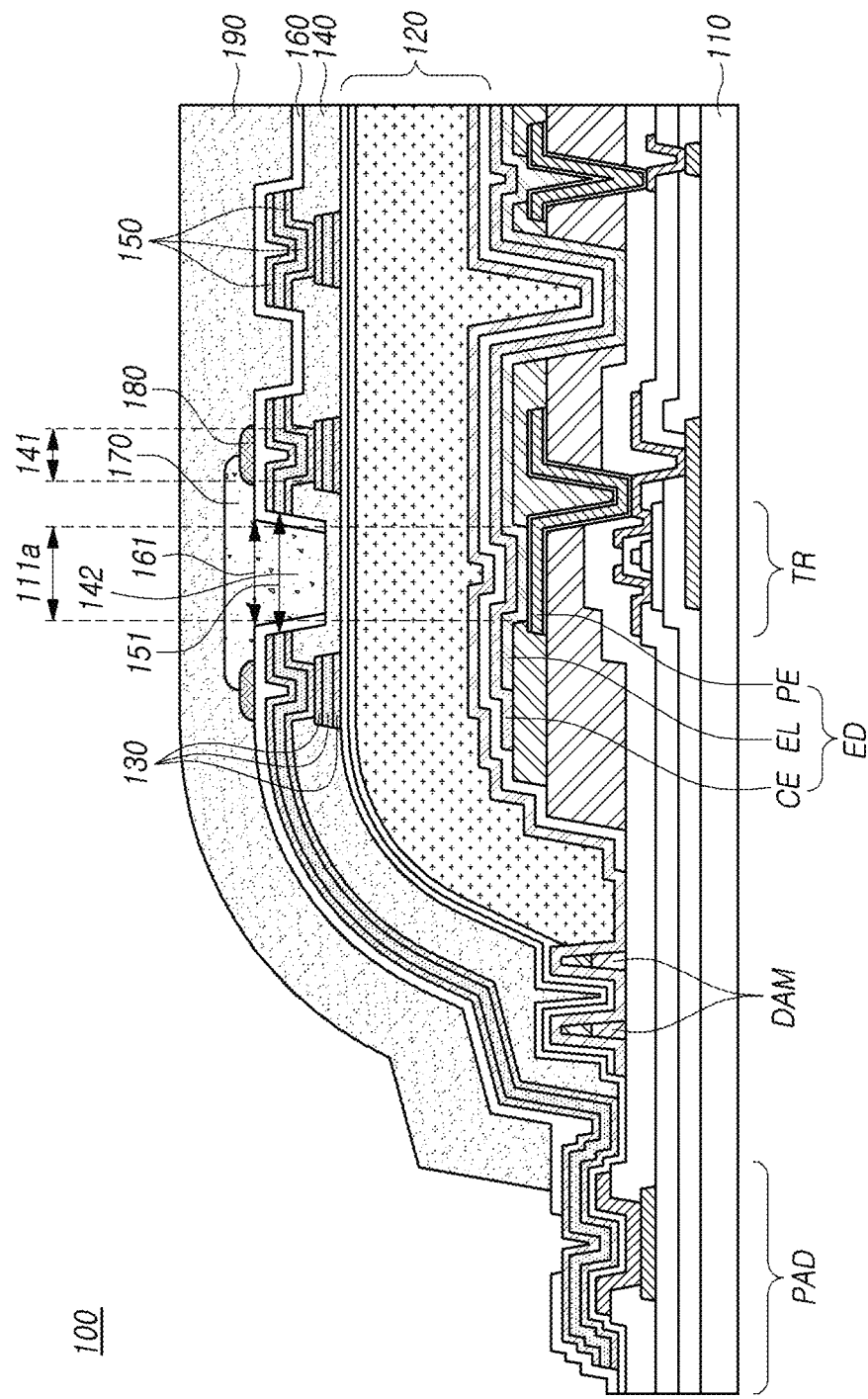
FIG. 8 illustrates a cross-section of a display panel according to embodiments of the present disclosure.

FIG. 8 is a cross-sectional view of a part of an active area and a part of a non-active area of the display panel 100 according to embodiments of the present disclosure.

The display panel 100 can include a substrate 110, an encapsulation layer 120 disposed on the substrate, a bridge 130 positioned on the encapsulation layer, a first insulating layer 140 disposed on the encapsulation layer, a touch electrode 150 disposed on the first insulating layer, a touch buffer layer 160 positioned on the touch electrode, and a color filter 170 positioned on the touch buffer layer.

The substrate 110 can include a plurality of subpixels including a light emitting region 111a.

The substrate 110 is a substrate on which circuit elements constituting the subpixel described above with reference to FIGS. 4 and 5 are formed, and can be a transistor substrate on which a plurality of transistors are positioned.

The encapsulation layer 120 is a layer for protecting circuit elements, such as light emitting devices, located on the substrate 110 from external moisture and oxygen, and can include a plurality of insulating films or layers.

The bridge 130 can be located at the periphery of the light emitting region 111a. The bridge 130 can be formed of, for example, an opaque material and can be positioned at the periphery of the light emitting region 111a so as not to overlap the light emitting region 111a.

The first insulating layer 140 is a layer for planarizing the bridge 130, and can include, for example, an organic material.

The bridge 130 can be in contact with the touch electrode 150. The first insulating layer 140 includes a first hole 141 corresponding to the bridge 130. The touch electrode 150 can contact the bridge 130 through the first hole 141.

The touch electrode 150 includes a second hole 151 corresponding to the light emitting region 111a. The second hole 151 can be a hole OA of the touch electrode described above with reference to FIGS. 6 and 7. Since the touch electrode 150 includes the second hole 151 corresponding to the light emitting region 111a, the display panel 100 can have high luminous efficiency even if the touch electrode 150 is formed of an opaque material.

Referring to FIG. 8, the touch buffer layer 160 is a layer positioned on the touch electrode 150 and can be an inorganic layer for protecting the touch electrode 150. The touch buffer layer 150 can be a single layer or a multi-layer.

The touch buffer layer 160 includes a third hole 161 located in the second hole 151 of the touch electrode 150. Since the touch electrode 150 includes the second hole 151 and the touch buffer layer 160 includes the third hole 161, the first insulating layer 140 positioned under the touch electrode 150 and the touch buffer layer 160 can be exposed by the second hole 151 and the third hole 161.

The color filter 170 can absorb a part of the light emitted from the light emitting device of the subpixel and transmit a part thereof, and can include an organic material.

The color filter 170 is in direct contact with the first insulating layer 140 through the third hole 161. In the case that the color filter 170 is in direct contact with the first insulating layer 140, for example, when the color filter 170 and the first insulating layer 140 are made of an organic material, the adhesive force between the color filter 170 and the first insulating layer 140 can be strong. Accordingly, the color filter 170 can have a stronger adhesive force than when the color filter 170 contacts the touch buffer layer 160 made of an inorganic material, and in the manufacturing process of the display panel 100, so that it is possible to effectively prevent the first insulating layer 140 and the layers positioned on the first insulating layer 140 from being delaminated.

The first insulating layer 140 can be an organic insulating layer, and the touch buffer layer 160 can be an inorganic insulating layer.

The first insulating layer 140 can include a concave portion 142 corresponding to the light emitting region 111a. In the case that the first insulating layer 140 includes the concave portion 142 corresponding to the light emitting region 111a, a halftone mask can be used in the manufacturing process of the display panel 100 so as to reduce the number of masks used in the manufacturing process.

The second hole 151 and the third hole 161 can be positioned to correspond to the concave portion 142.

The display panel 100 can include a black matrix 180 positioned on the touch electrode 150 and positioned at a periphery of the light emitting region 111a. The black matrix 180 can serve to prevent the light emitted from the light emitting regions of the subpixels expressing different colors from being mixed, and prevent external light from being reflected by the touch electrode 150, thereby improving the visibility.

The black matrix 180 can be positioned to overlap the bridge 130. In the case that the black matrix 180 is positioned to overlap the bridge 130, it is possible to prevent external light from being reflected by the bridge 130, thereby improving visibility.

The display panel 100 can include a second insulating layer 190 positioned on the touch electrode 150 and the color filter 170. The second insulating layer 190 can be an organic insulating layer including an organic material.

FIGS. 9 to 16 are cross-section views illustrating a display panel according to a manufacturing process of the display panel according to embodiments of the present disclosure.

Figure 9:
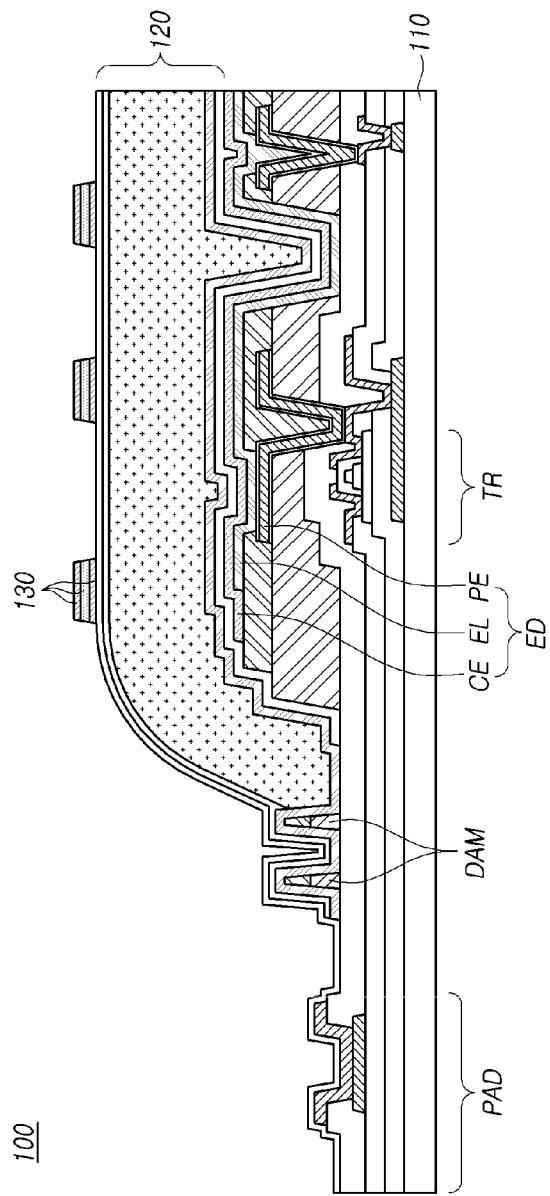
FIGS. 9 to 16 illustrate a manufacturing process of a display panel according to embodiments of the present disclosure.

In the display panel 100 shown in FIG. 9, the bridge 130 is patterned after the encapsulation layer 120 is formed.

Figure 10:
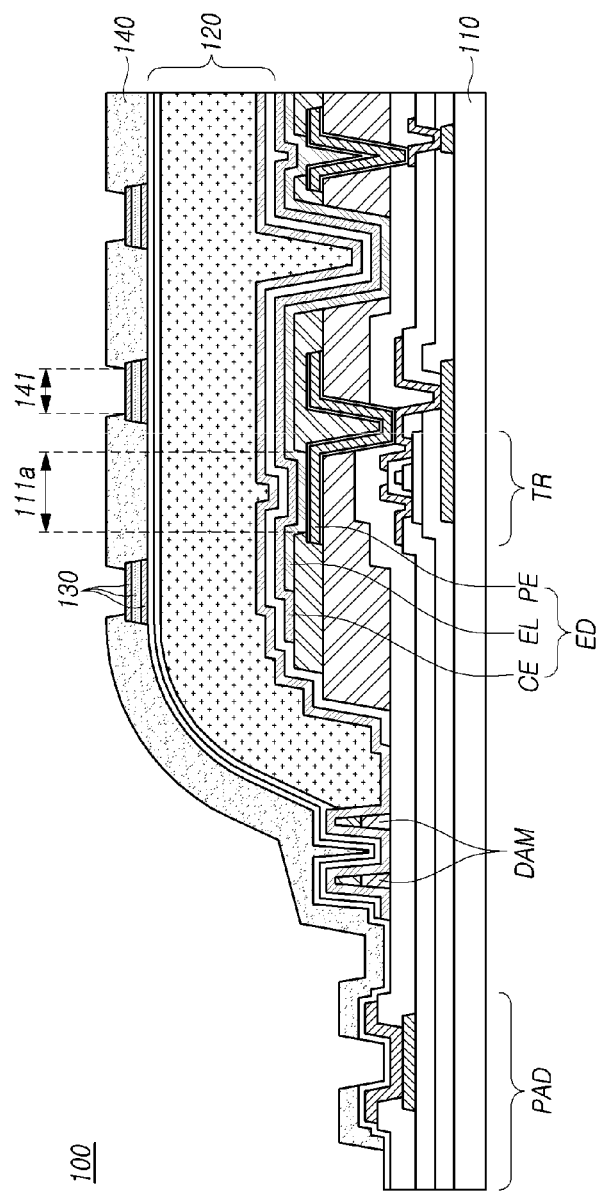

In the display panel 100 shown in FIG. 10, the first insulating layer 140 is formed by a halftone mask.

Figure 11:
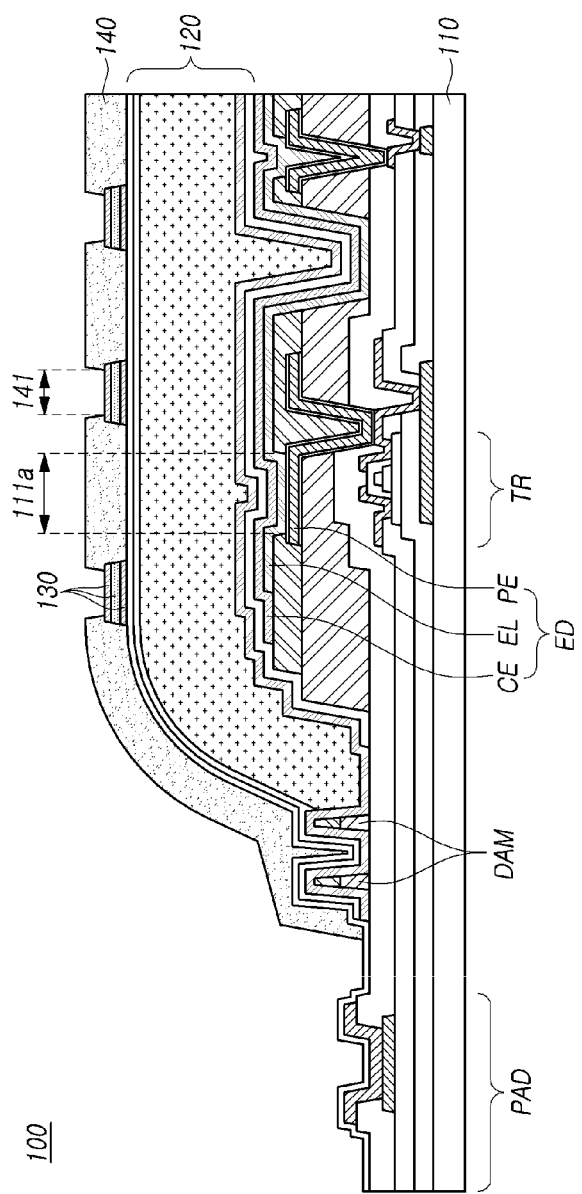

FIG. 11 illustrated the display panel 100 after performing an etching process. The electrode of the pad part PAD has been opened by the etching process, and the taper angle of the first insulating layer 140 on the dam DAM has been relaxed.

Figure 12:
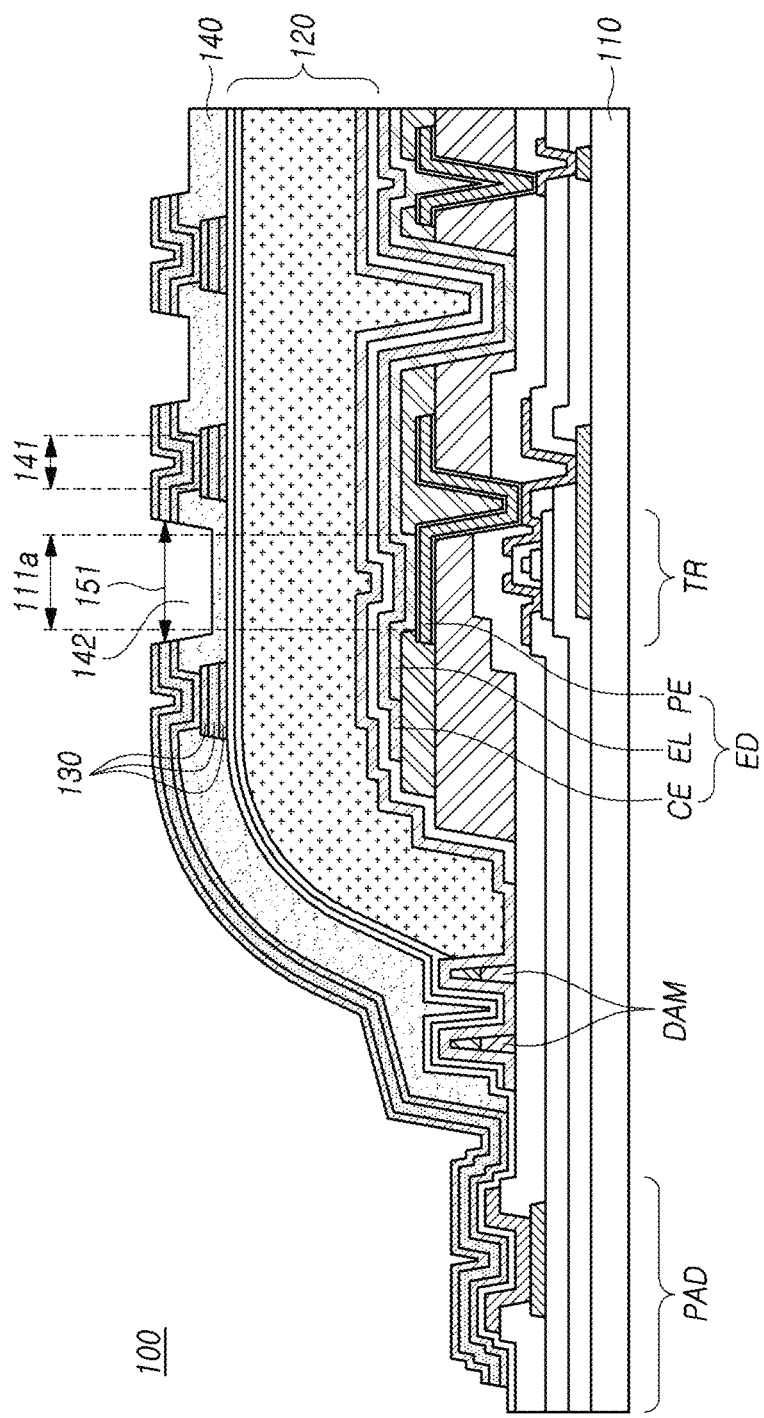

FIG. 12 illustrates a patterned touch electrode 150.

The touch electrode 150 can be formed to contact the bridge 130.

Figure 13:
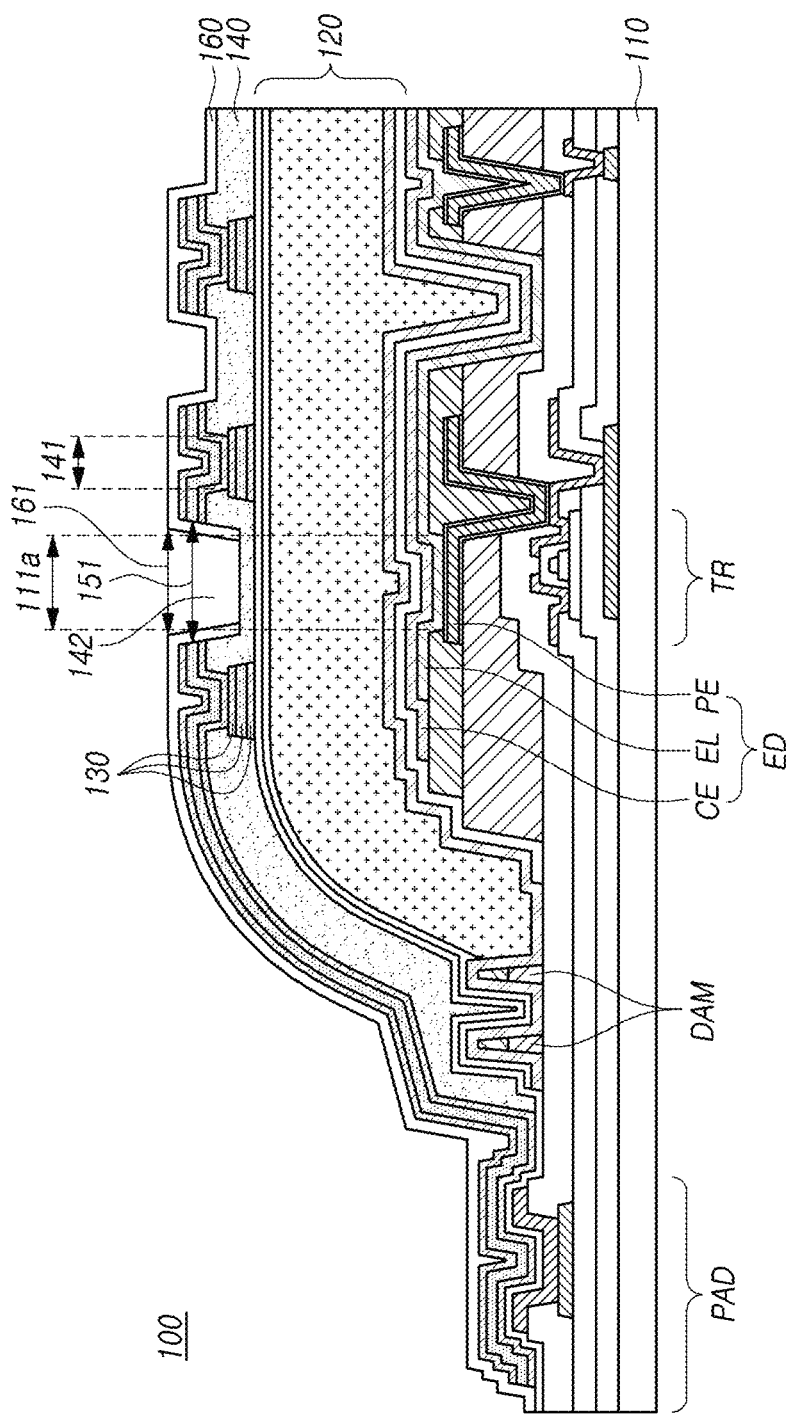

FIG. 13 illustrates the patterning of the touch buffer layer 160. Referring to FIG. 13, the first insulating layer 140 is exposed by the second hole 151 and the third hole 161.

Figure 14:
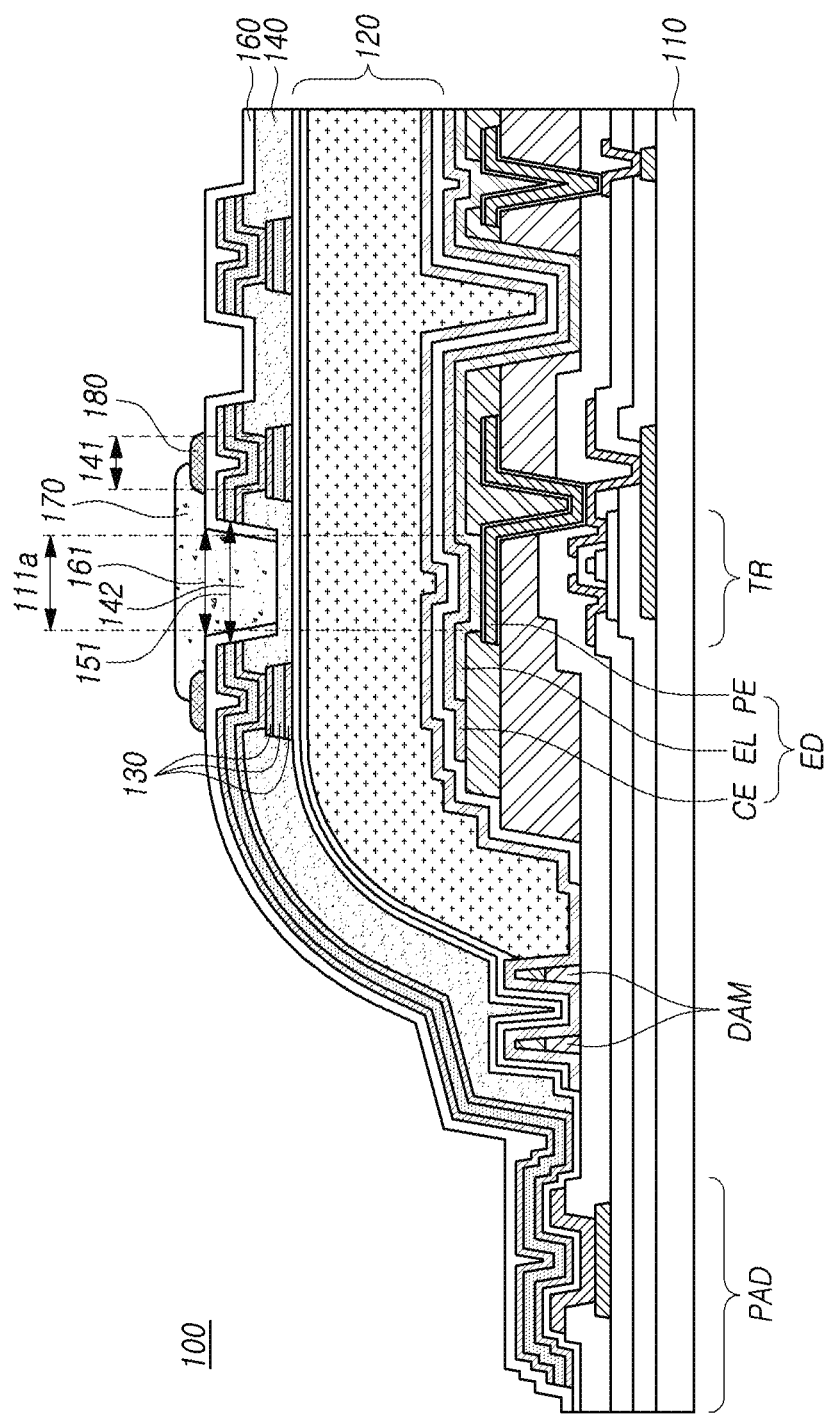

FIG. 14 illustrates the patterning of the color filter after patterning the black matrix 180. The color filter 170 can directly contact the first insulating layer 140 through the second hole 151 and the third hole 161.

Figure 15:
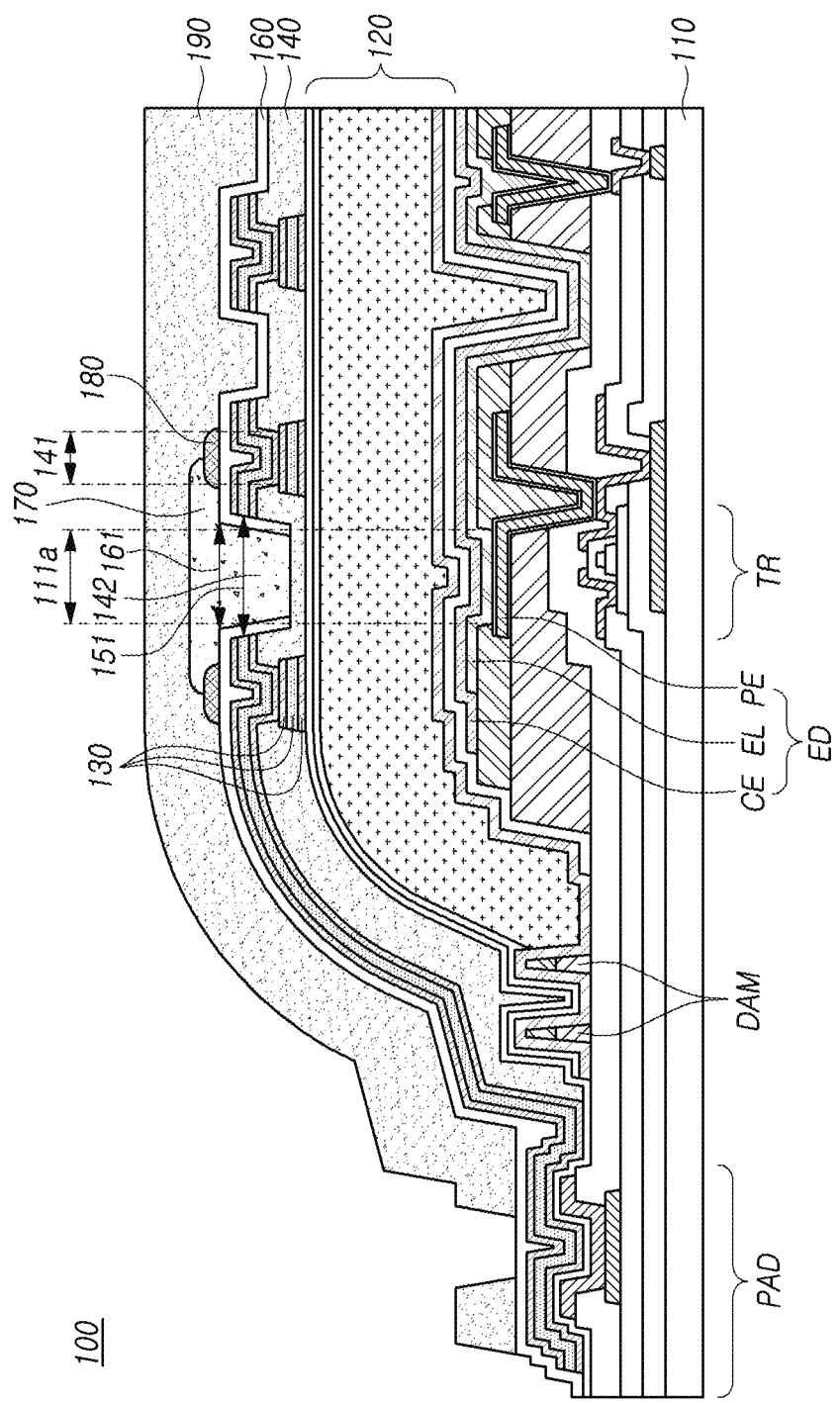

FIG. 15 illustrates a case in which a patterning process of opening the second insulating layer 190 in the pad part PAD is performed after the second insulating layer 190 is formed.

Figure 16:
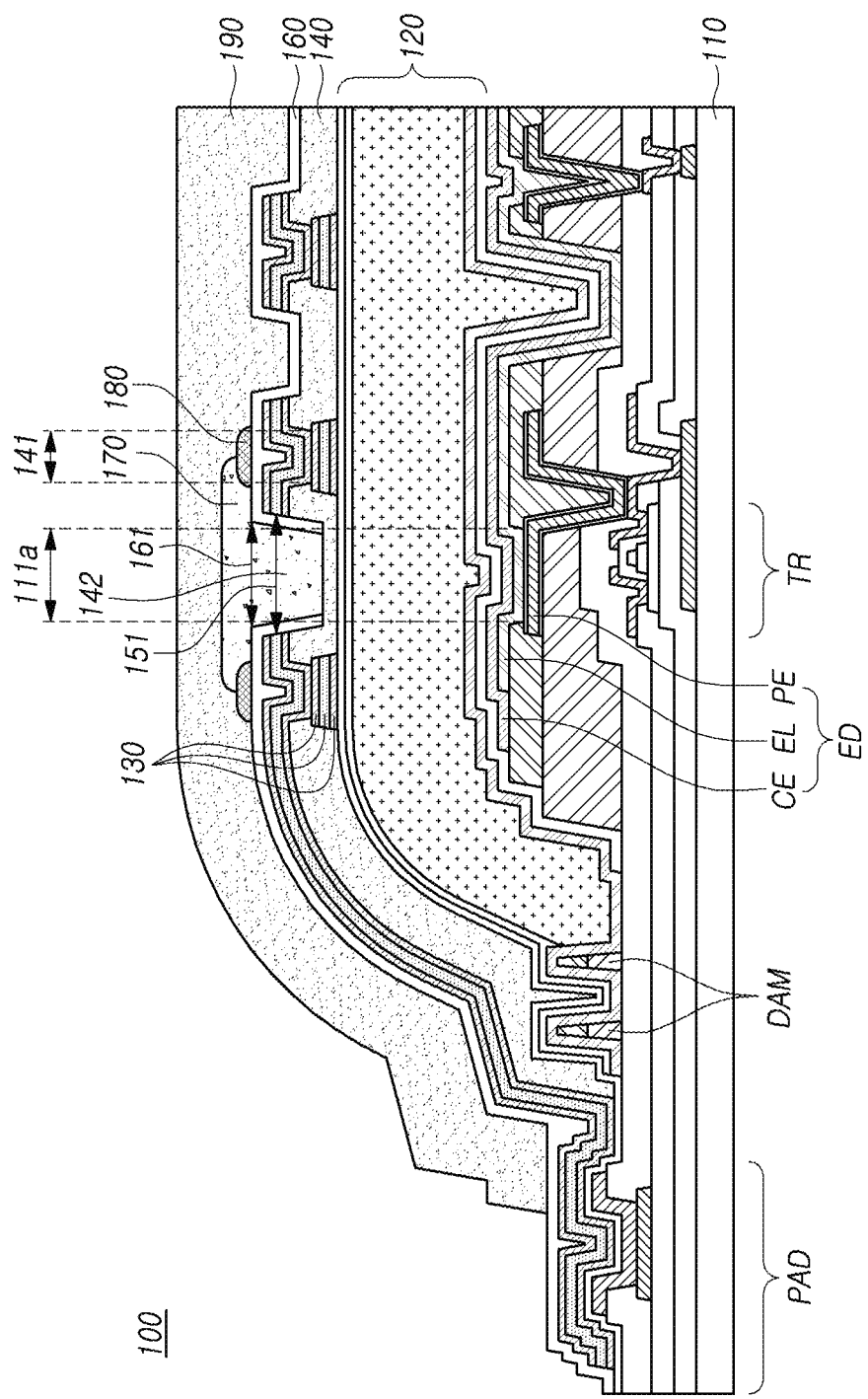

FIG. 16 illustrates the patterning of the touch buffer layer 160 of the pad part PAD.

In the case that the display panel 100 is formed by the manufacturing process shown in FIGS. 9 to 16, there can form the display panel 100 in which the color filter 170 is in direct contact with the first insulating layer 140, so that it is possible to manufacture the display panel 100 in which the taper on the dam DAM side of the first insulating layer 140 is relaxed.

In another aspect, embodiments of the present disclosure can provide a display device including a display panel and a control unit.

In the display device according to the embodiments of the present disclosure, the details on the display panel are the same as those described with respect to the display panel according to the embodiments of the present disclosure, and thus the description thereof will be omitted or may be briefly provided.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention.

The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display panel comprising:
   a substrate including a plurality of subpixels including a light emitting region;
   an encapsulation layer disposed on the substrate;
   a bridge disposed on the encapsulation layer and positioned at a periphery of the light emitting region;
   a first insulating layer disposed on the encapsulation layer and including a first hole corresponding to the bridge;
   a touch electrode disposed on the first insulating layer and including a second hole corresponding to the light emitting region, the touch electrode being in contact with the bridge through the first hole;
   a touch buffer layer disposed on the touch electrode and including a third hole positioned in the second hole; and
   a color filter disposed on the touch buffer layer and being in direct contact with the first insulating layer through the third hole.

2. The display panel of claim 1, wherein the first insulating layer is an organic insulating layer, and the touch buffer layer is an inorganic insulating layer.

3. The display panel of claim 1, wherein the first insulating layer includes a concave portion corresponding to the light emitting region.

4. The display panel of claim 3, wherein the second hole and the third hole are positioned to correspond to the concave portion.

5. The display panel of claim 1, further comprising a black matrix disposed on the touch electrode and positioned at the periphery of the light emitting region.

6. The display panel of claim 5, wherein the black matrix is positioned to overlap the bridge.

7. The display panel of claim 1, further comprising a second insulating layer disposed on the touch electrode and the color filter.

8. A display device comprising:
   a display panel; and
   a controller configured to control the display panel,
   wherein the display panel comprises:
      a substrate including a plurality of subpixels including a light emitting region;
      an encapsulation layer disposed on the substrate;
      a bridge disposed on the encapsulation layer and positioned at a periphery of the light emitting region;
      a first insulating layer disposed on the encapsulation layer and including a first hole corresponding to the bridge;
      a touch electrode disposed on the first insulating layer and including a second hole corresponding to the light emitting region, the touch electrode being in contact with the bridge through the first hole;

a touch buffer layer disposed on the touch electrode and including a third hole positioned in the second hole; and a color filter disposed on the touch buffer layer and being in direct contact with the first insulating layer through the third hole.

9. The display device of claim 8, wherein the first insulating layer is an organic insulating layer, and the touch buffer layer is an inorganic insulating layer.

10. The display device of claim 8, wherein the first insulating layer includes a concave portion corresponding to the light emitting region.

11. The display device of claim 10, wherein the second hole and the third hole are positioned to correspond to the concave portion.

12. The display device of claim 8, wherein the display panel further comprises a black matrix disposed on the touch electrode and positioned at the periphery of the light emitting region.

13. The display device of claim 12, wherein the black matrix is positioned to overlap the bridge.

14. The display device of claim 8, wherein the display panel further comprises a second insulating layer disposed on the touch electrode and the color filter.

\* \* \* \* \*